United States Patent
Jeong et al.

(10) Patent No.: US 11,805,687 B2
(45) Date of Patent: Oct. 31, 2023

(54) DISPLAY DEVICE AND MULTI-PANEL DISPLAY DEVICE

(71) Applicant: LG Display Co., Ltd., Seoul (KR)

(72) Inventors: WonGyu Jeong, Seoul (KR); JoongHa Lee, Paju-si (KR); WooJin Sim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 309 days.

(21) Appl. No.: 17/411,810

(22) Filed: Aug. 25, 2021

(65) Prior Publication Data

US 2022/0077272 A1 Mar. 10, 2022

(30) Foreign Application Priority Data

Sep. 8, 2020 (KR) ........................ 10-2020-0114718

(51) Int. Cl.
*H10K 59/131* (2023.01)
*H01L 25/10* (2006.01)

(52) U.S. Cl.
CPC ......... *H10K 59/131* (2023.02); *H01L 25/105* (2013.01)

(58) Field of Classification Search
CPC .. H10K 59/131; H10K 59/18; H10K 59/1315; H01L 25/105
See application file for complete search history.

(56) References Cited

U.S. PATENT DOCUMENTS

2020/0013846 A1* 1/2020 Kwon .................. H10K 59/18
2023/0237937 A1* 7/2023 Choi .................. H01L 25/0753
257/79

FOREIGN PATENT DOCUMENTS

| KR | 10-2005-0087581 A | 8/2005 |
| KR | 10-2015-0052188 A | 5/2015 |
| KR | 10-2020-0062635 A | 6/2020 |

* cited by examiner

*Primary Examiner* — Kyoung Lee
(74) *Attorney, Agent, or Firm* — Seed IP Law Group LLP

(57) ABSTRACT

A display device includes a plurality of signal lines disposed on the upper surface of the first substrate and electrically connected to the display unit, a plurality of link lines disposed below the first substrate, and a plurality of side lines which is disposed on a side surface of the first substrate and connecting the plurality of signal lines and the plurality of link lines, and each of the plurality of side lines includes a first conductive layer which is disposed on the side surface of the first substrate and is formed of first conductive particles and a second conductive layer which covers the first conductive layer and is formed of second conductive particles having a particle size larger than that of the first conductive particles. Accordingly, the contact resistance of the side line is lowered and the mechanical property is improved while minimizing a bezel area.

22 Claims, 13 Drawing Sheets

DISPLAY DEVICE AND MULTI-PANEL DISPLAY DEVICE

CROSS-REFERENCE TO RELATED APPLICATIONS

This application claims the priority of Korean Patent Application No. 10-2020-0114718 filed on Sep. 8, 2020, in the Korean Intellectual Property Office, the entire disclosure of which is incorporated herein by reference.

BACKGROUND

Technical Field

The present disclosure relates to a display device and a multi-panel display device, and more particularly, to a display device and a multi-panel display device which are capable of implementing a narrow bezel with excellent power efficiency and high reliability.

Description of the Related Art

Recently, as it enters an information era, a display field which visually expresses electrical information signals has been rapidly developed. Specific examples of such a display device include a liquid crystal display device (LCD), a plasma display panel device (PDP), a field emission display device (FED), and an organic light emitting display device (OLED).

Generally, display devices include a display panel having a display area in which images are displayed and a non-display area. Images are not substantially displayed in the non-display area and in some examples, this area is generally referred to as a bezel area.

In the meantime, the size and the shape of the display are gradually being diversified and in recent years, ultra-large size displays are attracting attention. In the ultra-large size displays, it is difficult to implement an ultra-large size screen with one panel, so that a multi-panel display device in which a plurality of display panels is connected is being used. However, in such multi-panel display devices, the bezel areas of the individual panels create seams that are visibly recognized by the user so that when one image is displayed on the entire screen, a sense of disconnection and awkwardness may be felt. Current multi-panel display devices may also have power consumption issues.

BRIEF SUMMARY

In various embodiments, the present disclosure provides a display device and a multi-panel display device which are capable of implementing a narrow bezel with excellent power efficiency and high reliability.

In one or more embodiments, the present disclosure provides a structure which is capable of improving a mechanical property while lowering a linear resistance and a contact resistance of a side line.

Technical benefits of the present disclosure are not limited to the above-mentioned technical benefits, and other technical benefits, which are not mentioned above, can be clearly understood by those skilled in the art from the following descriptions.

According to an aspect of the present disclosure, a display device includes a first substrate including a display area and a non-display area enclosing the display area, a display unit including an organic light emitting diode disposed on an upper surface of the first substrate, a plurality of signal lines which is disposed on the upper surface of the first substrate and is electrically connected to the display unit, a plurality of link lines disposed below the first substrate, and a plurality of side lines which is disposed on a side surface of the first substrate, connects the plurality of signal lines and the plurality of link lines, each of the plurality of side lines includes a first conductive layer which is disposed on the side surface of the first substrate and is formed of first conductive particles and a second conductive layer which covers the first conductive layer and is formed of second conductive particles having a particle size larger than that of the first conductive particle.

According to another aspect of the present disclosure, a multi-panel display device includes a plurality of display devices disposed to be adjacent to each other, wherein each of the plurality of display devices includes a first substrate including a display area and a non-display area enclosing the display area, a display unit including an organic light emitting diode disposed on an upper surface of the first substrate, a plurality of signal lines which is disposed on the upper surface of the first substrate and is electrically connected to the display unit, a plurality of link lines disposed below the first substrate, a plurality of side lines which is disposed on a side surface of the first substrate, connects the plurality of signal lines and the plurality of link lines; and a protective layer which covers the plurality of side lines and includes a black material, each of the plurality of side lines includes a first conductive layer which is disposed on the side surface of the first substrate and is formed of first conductive particles; and a second conductive layer which covers the first conductive layer and is formed of second conductive particles having a particle size larger than that of the first conductive particles.

According to another aspect of the present disclosure, the multi-panel display device has excellent performances such as thin-thickness, light weight, and low power consumption. The non-display area is defined along a periphery of the display area, a plurality of driving circuits are disposed in the non-display area, and a printed circuit board (PCB) supplies control signals to the plurality of driving circuits. A plurality of link lines which connects the display panel and the driving circuits are disposed in the non-display area. Further, the non-display area is blocked by a black matrix of the display panel or a case so that the images are not substantially displayed in the non-active area. In order to increase an effective display screen size with the same area, the driving circuits and the link lines are disposed in a lower portion of the display panel corresponding to the non-display area and a side line is disposed on a side surface to electrically connect the display panel and the driving circuits in some embodiments.

According to another aspect of the present disclosure, a multi-panel display device may implement an ultra-large size screen by disposing a plurality of display panels in a tile pattern with a bezel area of each display panel minimized to improve the viewing experience for the user. Further, the multi-panel display devices of the present disclosure have improved power efficiency characteristics for improved luminance and higher degrees of circuit integration.

Other detailed matters of the embodiments are included in the detailed description and the drawings.

According to the present disclosure, in the display device, the mechanical property may be improved while lowering a contact resistance of the side line. Accordingly, the power efficiency and the reliability of the display device are improved.

According to the present disclosure, a multi-panel display device which reduces a bezel area to improve the image quality and reduce the power consumption may be provided.

According to the present disclosure, migration of the side line is suppressed and the adhesiveness is improved, to provide excellent reliability.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
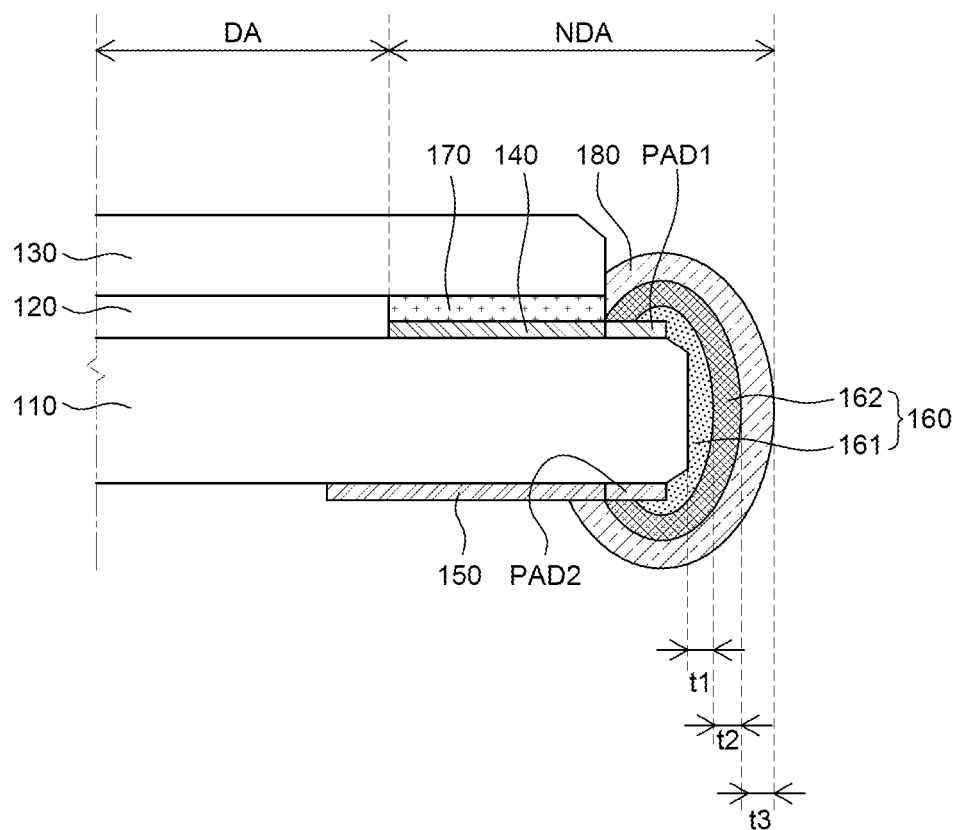
FIG. 1 is a cross-sectional view of a display device according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to embodiments of the present disclosure will be described in detail with reference to accompanying drawings.

Throughout the specification, unless otherwise specified, a particle size is a particle size at a point (D50) at which an accumulated volume is 50% in an accumulative particle size distribution.

Figure 2:
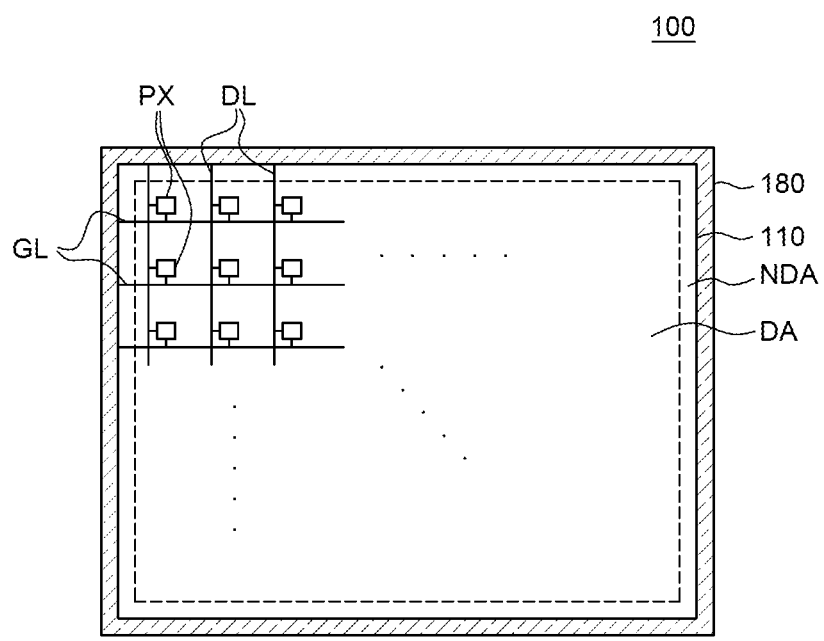
FIG. 2 is a top view of a first substrate in a display device according to an embodiment of the present disclosure.
Figure 3:
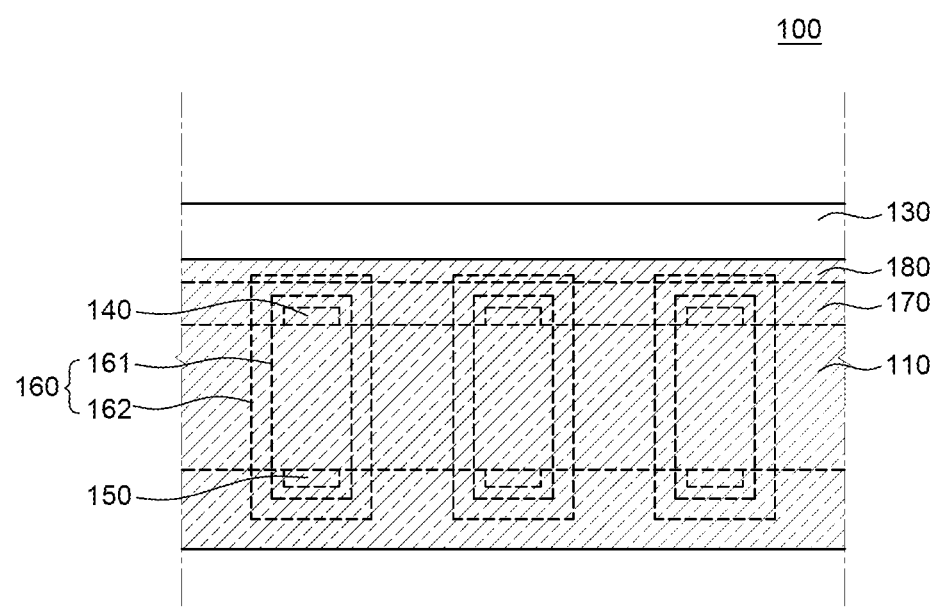
FIG. 3 is a side view of a display device according to an embodiment of the present disclosure.

FIGS. 1 to 3 are views for explaining a display device according to an embodiment of the present disclosure. FIG. 1 is a schematic cross-sectional view of a display device according to an embodiment of the present disclosure. FIG. 2 is a schematic top view of a first substrate in a display device according to an embodiment of the present disclosure. FIG. 3 is a side view of a display device according to an embodiment of the present disclosure.

Referring to FIGS. 1 to 3, a display device 100 according to an embodiment of the present disclosure includes a first substrate 110, a display unit 120 (which may also be referred to herein as a display panel 120), a sealant 170, a second substrate 130, a plurality of signal lines 140, a plurality of link lines 150, a plurality of side lines 160, and a protective layer 180. The side lines 160 includes a first conductive layer 161 and the second conductive layer 162.

The first substrate 110 is a base substrate for supporting various components of the display unit. The first substrate 110 may be formed of an insulating material. For example, the first substrate 110 may be a glass or plastic material. The first substrate 110 may be a plastic film having a flexibility so as to be bendable as needed.

In the first substrate 110, a display area DA and a non-display area NDA enclosing the display area DA may be defined. The display area DA is an area where images are actually displayed in the display device and in the display area DA, the display unit 120 which will be described below is disposed. The non-display area NDA is an area where images are actually not displayed so that the non-display area NDA may be defined as an edge area of the first substrate 110 which encloses the display area DA. In the non-display area NDA, various wiring lines, such as a gate line and a data line which are connected to the thin film transistor of the display unit 120 disposed in the display area DA, may be disposed. Further, in the non-display area NDA, a driving circuit, for example, a data driving integrated circuit chip or a gate driving integrated circuit chip may be disposed and a plurality of pads may be disposed, but is not limited thereto.

A plurality of pixels PX is defined in the display area DA of the first substrate 110. Each of the plurality of pixels PX is an individual unit which emits light and includes red, green, and blue pixels. If necessary, a white pixel may be included. In each of the plurality of pixels PX, the display unit 120 is formed.

The display unit 120 displays images. For example, the display unit 120 includes an organic light emitting diode and a circuit unit for driving the organic light emitting diode. Specifically, the organic light emitting diode may include an anode, at least one organic layer, and a cathode so that electrons and holes are coupled to emit light. The organic layer includes an organic light emitting layer, and additionally, includes a hole injection layer, a hole transport layer, an electron transport layer, and an electron injection layer, but is not limited thereto. For example, the circuit unit may include a plurality of thin film transistors, a capacitor, and a plurality of wiring lines to drive the organic light emitting diode.

When the display device 100 is driven in a top emission manner, the circuit unit is disposed on the first substrate 110 and the organic light emitting diode is disposed on the circuit unit. Specifically, the thin film transistor is disposed on the first substrate 110, a planarization layer is disposed on the thin film transistor, and the anode, the plurality of organic layers including an organic light emitting layer, and the cathode are sequentially disposed on the planarization layer to configure the display unit 120.

The second substrate 130 is disposed on the display unit 120 to be opposite to the first substrate 110. The second substrate 130 is an encapsulation substrate which protects the display unit 120 from moisture or air permeating from the outside or a physical impact. For example, the second substrate 130 may be selected from a metal foil and a plastic substrate, but is not limited thereto and may be an encapsulation layer formed by being coated with an organic material and/or an inorganic material.

The sealant 170 is disposed between the first substrate 110 and the second substrate 130 in the non-display area NDA. The sealant 170 is disposed to enclose an outer periphery of the display unit 120 and bonds the first substrate 110 and the second substrate 130. The sealant 170 blocks moisture and oxygen permeating from a side surface of the display unit 120 and is referred to as a dam. When the second substrate 130 does not have a plate shape, such as glass, metal foil, or a plastic substrate, but may be an encapsulation layer formed to be coated with an organic material and/or an inorganic material, the sealant 170 may be omitted.

The plurality of signal lines 140 is disposed on an upper surface of the first substrate 110 and the plurality of link lines 150 is disposed on a rear surface of the first substrate 110. The plurality of signal lines 140 is electrically connected to the component of the display unit 120 to transmit a signal to the display unit 120. The plurality of link lines 150 is wiring lines which connect the plurality of signal lines formed on the upper surface of the first substrate 110 and the driving circuit.

Specifically, referring to FIGS. 1 and 2 together, the plurality of signal lines 140 disposed on the upper surface of the first substrate 110 may be a plurality of gate lines GL and a plurality of data lines DL. The plurality of gate lines GL and the plurality of data lines DL are electrically connected to the thin film transistor of the display unit 120 disposed in the display area DA to transmit a gate signal and a data signal.

In the meantime, the plurality of link lines 150 disposed on the rear surface of the first substrate 110 may be a plurality of gate link lines and a plurality of data link lines. The plurality of gate link lines is wiring lines which connect the plurality of gate lines GL disposed on the upper surface of the first substrate 110 and the gate driving circuit. The plurality of data link lines is wiring lines which connect the plurality of data lines DL disposed on the upper surface of the first substrate 110 and the data driving circuit. The plurality of gate link lines and the plurality of data link lines may extend from an end of the rear surface of the first substrate 110 to a center of the rear surface of the first substrate 110.

Further, on the rear surface of the first substrate 110, a gate driving circuit is disposed to be electrically connected to the plurality of gate link lines and a data driving circuit is disposed to be electrically connected to the plurality of data link lines. At this time, the gate driving circuit and the data driving circuit may be formed directly on the rear surface of the first substrate 110 and may be disposed on the rear surface of the first substrate 110 in a chip on film manner. As another example, the gate driving circuit and the data driving circuit may be connected to the printed circuit board. The printed circuit board may transmit various signals to the plurality of signal lines 140 and the display unit 120 formed on the first substrate 110.

Referring to FIG. 1 again, each of the plurality of signal lines 140 may include a first pad unit PAD1 and each of the plurality of link lines 150 may include a second pad unit PAD2. The first pad unit PAD1 and the second pad unit PAD2 are areas which are in contact with the side line 160. The first pad unit PAD1 may be a conductive layer extending from the plurality of signal lines 140 and the second pad unit PAD2 may be a conductive layer extending from the plurality of link lines 150. The first substrate 110 protrudes outwardly from the second substrate 130. An end of the plurality of signal lines 140 disposed on the upper surface of the first substrate 110, that is, an upper surface of the first pad unit PAD1 is exposed. Accordingly, the side line 160 which electrically connects the plurality of signal lines 140 and the plurality of link lines 150 may be in contact with not only the side surface of the signal line 140, but also the upper surface. As described above, when a contact area with the signal line 140 of the side line 160 is increased, the current which is transmitted to the signal line 140 by means of the side line is significantly increased. Accordingly, it is easy to implement a large size display device.

Referring to FIG. 1 continuously, the plurality of side lines 160 is disposed on the side surface of the first substrate 110. The plurality of side lines 160 electrically connects the plurality of signal lines 140 disposed on the upper surface of the first substrate 110 and the plurality of link lines 150 disposed on the rear surface of the first substrate 110.

The plurality of side lines 160 is disposed to cover ends of the plurality of signal lines 140 disposed on the upper surface of the first substrate 110, the side surface of the first substrate 110, and ends of the plurality of link lines 150 disposed on the rear surface of the first substrate 110. That is, the plurality of side lines 160 is disposed to continuously cover the first pad unit PAD1 of the plurality of signal lines 140, the side surface of the first substrate 110, and the second pad unit PAD2 of the plurality of link lines 150. Further, the plurality of side lines 160 is in direct contact with the first pad unit PAD1, the side surface of the first substrate 110, and the second pad unit PAD2.

Specifically, the plurality of side lines 160 may include a first side line and a second side line. The first side line connects the gate line GL formed on the upper surface of the first substrate 110 and the gate link line formed on the rear surface of the first substrate 110. The second side line connects the data line DL formed on the upper surface of the first substrate 110 and the data link line formed on the rear surface of the first substrate 110.

Each of the plurality of side lines 160 includes a first conductive layer 161 and a second conductive layer 162.

The first conductive layer 161 is disposed to continuously cover ends of the signal lines 140 formed on the upper surface of the first substrate 110, the side surface of the first substrate 110, and ends of the link lines 150 formed on the rear surface of the first substrate 110. That is, the first conductive layer 161 is disposed to be in direct contact with an upper surface and a side surface of the first pad unit PAD1, the side surface of the first substrate 110, and a lower surface and a side surface of the second pad unit PAD2.

The second conductive layer 162 is disposed to cover the first conductive layer 161. The second conductive layer 162 is disposed to continuously cover the upper surface of the first pad unit PAD1, the first conductive layer 161, and a lower surface of the second pad unit PAD2. The second conductive layer 162 may be disposed to be in direct contact with the upper surface of the first pad unit PAD1 which is not covered with the first conductive layer 161 to be exposed, the first conductive layer 161, and the lower surface of the second pad unit PAD2. That is, the second conductive layer 162 fully covers the first conductive layer 161 such that the first conductive layer 161 is not exposed.

The side line 160 is patterned to connect the plurality of corresponding signal lines 140 and the plurality of corresponding link lines 150 to each other. That is, the first conductive layer 161 is patterned to connect the plurality of corresponding signal lines 140 and the plurality of corresponding link lines 150 to each other. Further, the second conductive layer 162 is patterned to connect the plurality of corresponding signal lines 140 and the plurality of corresponding link lines 150 to each other, similarly to the first conductive layer 161. For example, the first conductive layer 161 and the second conductive layer 162 may be formed by a pad printing method, but is not limited thereto. A step is caused on the side surface of the first substrate 110 on which the first conductive layer 161 and the second conductive layer 162 are formed. However, the pad printing method uses a silicon rubber pad having an elasticity such as PDMS, so that the conductive layer may be easily formed on a surface having a step.

The first conductive layer 161 and the second conductive layer 162 may include conductive particles. The first conductive layer includes first conductive particles, and the second conductive layer includes second conductive particles. For example, the first conductive particles and the second conductive particles may include one or more metals selected from silver (Ag), gold (Au), platinum (Pt), palladium (Pd), and copper (Cu). For example, the first conductive particles and the second conductive particles may include silver (Ag), or an alloy thereof, which is hardly oxidized and has an excellent electrical property.

A size of the first conductive particles included in the first conductive layer 161 is smaller than a size of the second conductive particles included in the second conductive layer 162. For example, the particle size of the first conductive particle may be nanometers (nm) to 400 nm, 10 nm to 300 nm, 10 nm to 150 nm, 10 nm to 100 nm, 20 nm to 100 nm, or 100 nm to 300 nm. The particle size of the second conductive particle may be 1 micrometer (μm) to 5 μm, 1.5 μm to 4 μm, 1 μm to 3.5 μm, or 3 μm to 5 μm.

The second conductive particle size may be 5 times to 20 times, 10 times to times, or 5 times to 15 times of the first conductive particle size. Within this range, it is advantageous in that both the electrical characteristic and the mechanical property of the side lines 160 may be excellent.

The side line 160 has a structure in which the first conductive layer 161 formed of the first conductive particles and the second conductive layer 162 formed of the second conductive particles having a particle size smaller than the first conductive particles are laminated. Therefore, it is possible to lower a contact resistance, improve the electrical characteristic, and improve the mechanical property. By doing this, the power consumption is reduced and the mechanical property is significantly improved so that a display device having a high reliability and excellent display quality may be provided.

Each of the first conductive layer 161 and the second conductive layer 162 may further include resins. The resin provides adhesiveness between interfaces. For example, the resin may be an epoxy resin. The epoxy resin improves the adhesion between the interfaces and has strong resistance against the stress change after being cured, and protects the first conductive layer 161 and the second conductive layer 162 from the physical impact. For example, the first conductive layer 161 may include 10 weight % to 30 weight % of resin based on a sum of the first conductive particles and the resin. For example, the second conductive layer 162 may include 20 weight % to 40 weight % of resin based on a sum of the second conductive particles and the resin. However, a content ratio of the resin is not limited thereto and may vary depending on the particle sizes of the first conductive particles and the second conductive particles and the method of patterning the conductive layers.

The first conductive layer 161 may be formed from a first paste including the first conductive particles and a curable resin. The second conductive layer 162 may be formed from a second paste including the second conductive particles and a curable resin. For example, the first conductive layer 161 may be formed by performing pad-printing on the first paste and the second conductive layer 162 may be formed by performing pad-printing on the second paste. The first paste layer is formed on the side surface of the first substrate by performing pad-printing on the first paste and the second paste layer is laminated to cover the first paste layer by performing pad-printing on the second paste. Thereafter, a thermal treatment is performed collectively thereon to form the first conductive layer and the second conductive layer. A detailed description thereof will be made with reference to FIGS. 4A and 4B.

When the first paste layer and the second paste layer are laminated and then are subjected to the thermal treatment, the first conductive particles included in the first paste layer are sintered and the curable resin is cured to form the first conductive layer. Further, the second conductive particles included in the second paste layer are sintered and the curable resin is cured to form the second conductive layer. At this time, the degree of sintering of the first conductive particles and the second conductive particles may be different due to the difference in the particle sizes of the first conductive particles and the second conductive particles, under the same thermal treatment condition. The degree of sintering of the first conductive particles having a relatively small particle size is large and the degree of sintering of the second conductive particles having a relatively large particle size is small. Therefore, the viscosity of the first conductive particles having a relatively small particle size is quickly lowered during the thermal treatment, that is, the first conductive particles are melted to increase the contact area at the interface. Accordingly, the first conductive layer 161 formed by sintering the first conductive particles has a larger contact area with the signal line 140 and the link line 150 so that it is advantageous in that a contact resistance (an interface resistance) is low and the adhesiveness is excellent. Further, the first conductive particles are quickly melted by the thermal treatment to be sintered to a single lump so that the linear resistance of the first conductive layer 161 may be lowered. As described above, as the contact resistance and the linear resistance of the first conductive layer 161 are lowered, the current transmitted to the signal line 140 and the link line 150 by means of the side line 160 may be significantly increased.

In the meantime, the second conductive layer 162 is formed by sintering the second conductive particles having a particle size relatively larger than that of the first conductive layer 161. Since the particle size is relatively large, the viscosity of the second conductive particles is relatively slowly lowered during the same thermal treatment to be sintered with a density lower than that of the first conductive layer 161. Therefore, the second conductive layer 162 having a relatively low density may have a surface hardness higher than that of the first conductive layer 161. Accordingly, the second conductive layer may protect the first conductive layer 161 and improve the rigidity of the side line 160.

A total thickness ($t_1+t_2$) of the side line 160 including the first conductive layer 161 and the second conductive layer 162 is very thin to be 4 μm to 10 μm, 4.5 μm to 7 μm, or 4 μm to 6 μm. Accordingly, it is possible to implement a narrow bezel display device having a high power efficiency and a high reliability while reducing the bezel area.

As the thickness $t_1$ of the first conductive layer 161 is designed to be thinner, when the first conductive layer 161 is formed, the degree of sintering of the first conductive particles is increased so that the electric conductivity is improved. However, as the thickness $t_1$ of the first conductive layer 161 becomes thinner, the content of the resin included in the first conductive layer 161 is reduced so that the adhesiveness of the first conductive layer 161 may be degraded. By doing this, the first conductive layer 161 may be separated from the side surface of the first substrate 110. Further, when the content of the resin in the first conductive layer 161 is small, the moisture permeation is increased so that the ionization of the conductive particles may be accelerated due to the moisture. The ionized particles cause migration to cause the defect of the wiring lines. Therefore, it is desirable to form the first conductive layer 161 to have the thickness $t_1$ of 1 μm or larger.

For example, the thickness $t_1$ of the first conductive layer 161 may be 1 μm to 6 μm, 1.5 μm to 5 μm, 1.5 μm to 3 μm, or 1.5 μm to 2 μm and within this range, the adhesiveness is excellent, the contact resistance is low, and the wiring line defect is minimized.

In the meantime, the thickness $t_2$ of the second conductive layer 162 may be 2 μm to 8 μm, 2.5 μm to 6 μm, or 3 μm to 5 μm. Within this range, it is advantageous in that the surface hardness is improved while maintaining an electrical property of the side line 160 to be high.

Further, the thickness $t_2$ of the second conductive layer 162 may be equal to or larger than the thickness $t_1$ of the first conductive layer 161. For example, a ratio of the thickness $t_2$ of the second conductive layer 162 to the thickness $t_1$ of the first conductive layer 161 may be 1:0.3 to 1:1. As described above, as the first conductive layer 161 becomes thinner, the contact resistance is further reduced to improve the electrical characteristic, but the adhesiveness may be reduced, or migration may be accelerated. Accordingly, in order to minimize the generation of the migration while maintaining the electrical characteristic and the adhesiveness to be high, the ratio of the thickness $t_2$ of the second conductive layer 162 to the thickness $t_1$ of the first conductive layer 161 may be formed in the range of 1:0.4 to 1:0.7.

Widths of the first conductive layer 161 and the second conductive layer 162 are not specifically limited, but it is desirable to be larger than a width of the signal line 140 and the link line 150 to increase the contact area between wiring lines.

The protective layer 180 is formed to cover the plurality of side lines 160. The protective layer 180 includes a black material so that the side line 160 is not visible from the outside. The plurality of side lines 160 is formed of a metal material having a glossy property such as silver (Ag), so that external light or light emitted from the display unit 120 is reflected to be recognized by the user. Therefore, the protective layer 180 is formed of an insulating material including a black material. That is, the protective layer 180 may be an insulating layer including a black material.

For example, a sum of the thickness $t_1$ of the first conductive layer 161, the thickness $t_2$ of the second conductive layer 162, and the thickness $t_3$ of the protective layer 180 may be 15 μm or smaller or 5 μm to 15 μm. In this case, the bezel area is minimized to implement a narrow bezel display device.

The display device 100 according to the embodiment of the present disclosure includes a plurality of side lines 160 which electrically connects a plurality of signal lines 140 disposed on the upper surface of the first substrate 110 and the plurality of link lines disposed on the lower surface of the first substrate 110. At this time, each of the plurality of side lines 160 includes the first conductive layer 161 having the first conductive particles and the second conductive layer 162 which is disposed to cover the first conductive layer 161 and is formed of the second conductive particles having a particle size larger than that of the first conductive particles. The first conductive layer 161 includes the first conductive particles having a small particle size so that the linear resistance is low and a contact resistance with the signal line 140 and the link line 150 is low. Further, the second conductive layer 162 supplements the surface hardness of the first conductive layer 161 to simultaneously improve the electrical characteristic and the mechanical property of the side line 160. Accordingly, the power efficiency and the reliability of the display device 100 are improved. Further, the first conductive layer 161 and the second conductive layer 162 formed of conductive particles having different particle sizes are laminated without increasing the thickness of the side line 160, to implement a narrow bezel display device.

Figure 4A:
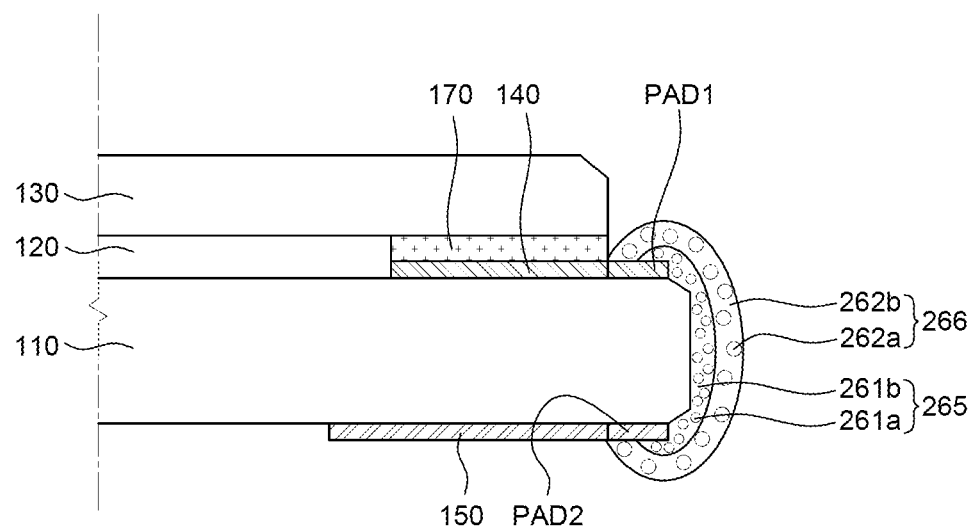
FIG. 4A is a view illustrating a state before performing a thermal treatment during a process of forming a first conductive layer and a second conductive layer in a display device according to another embodiment of the present disclosure.
Figure 4B:
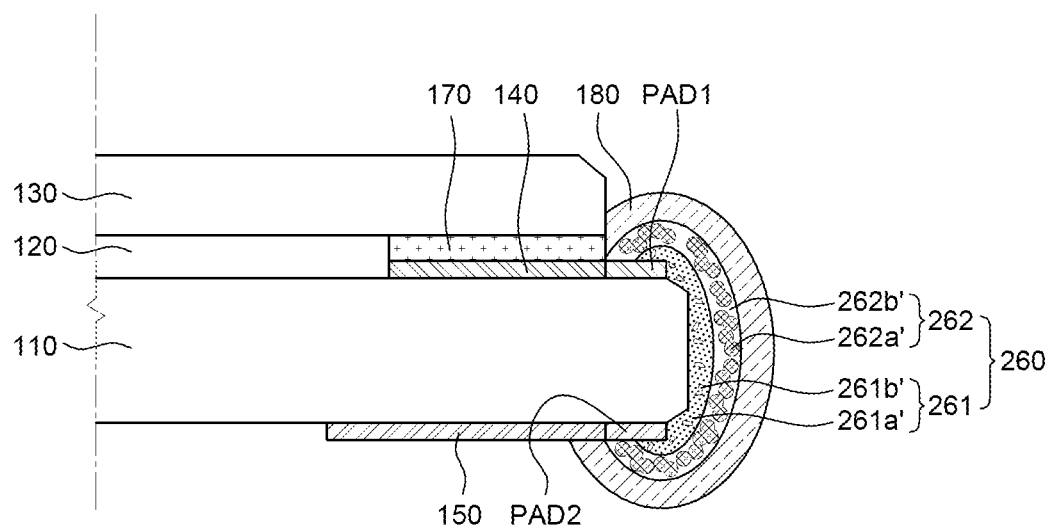
FIG. 4B is a view illustrating a state after performing s thermal treatment on a first conductive layer and a second conductive layer in a display device according to another embodiment of the present disclosure.

FIGS. 4A and 4B are views for explaining a display device according to another embodiment of the present disclosure. FIG. 4A is a view illustrating a state before a thermal treatment during the process of forming a first conductive layer and a second conductive layer of a display device according to another embodiment of the present disclosure and FIG. 4B is a cross-sectional view of a display device after a thermal treatment. The structures of a first conductive layer and a second conductive layer of the embodiment illustrated in FIGS. 4A and 4B are different from that of the embodiment illustrated in FIGS. 1 to 3, but the other components are substantially the same. Therefore, a redundant description will be omitted.

In FIG. 4A, it is illustrated that shapes of first conductive particles 261a and second conductive particles 262a have a spherical shape, but are not limited thereto.

As described above, the first conductive layer 261 and the second conductive layer 262 may be patterned by the pad printing method. Specifically, the first conductive layer 261 and the second conductive layer 262 may be formed by the pad printing method including the following steps: i) A first paste including first conductive particles 261a and a curable resin 261b is applied on a metal plate in which an engraved pattern portion is formed, and the first paste applied on a portion except for the engraved pattern portion is removed. ii) After smearing the pattern of the first paste filled in the engraved pattern portion with a silicon pad, the pattern of the first paste is disposed to be in contact with the signal line 140 of the first substrate 110, the side surface of the first substrate 110, and the link line 150 to form a first paste layer 265. iii) Next, simple drying (or simple curing) is performed. Depending on a desired thickness, steps i) to iii) may be repeated. iv) A second paste layer 266 is formed using a second paste including second conductive particles 262a and a curable resin 262b with the same processes as the steps i) to iii) to cover the first paste layer 265. Similarly, depending on a desired thickness, the second paste layer 266 may be further provided. v) The laminated first paste layer 265 and second paste layer 266 are subjected to the thermal treatment to form the first conductive layer 261 and the second conductive layer 262. Such a pad printing method is illustrative but is not limited thereto.

Referring to FIGS. 4A and 4B, when the first paste layer 265 is subjected to the thermal treatment, the first conductive particles 261a having a relatively smaller particle size is rapidly melted. Therefore, the first conductive particles 261a of the first conductive layer 261 do not maintain a spherical shape and is melted to be fixed as a single lump to form a first conductive portion 261a'. The curable resin 261b of the first paste layer 265 is cured during the thermal treatment process to form a first cured resin portion 261b'.

In contrast, the second conductive particles 262a having a relatively larger particle size may not be easily melted under the same thermal treatment condition. Therefore, the second conductive particles 262a of the second conductive layer 262 are partially in contact with each other to be aggregated while maintaining the spherical shape somewhat to form a plurality of second conductive portions 262a'. The plurality of second conductive portions 262a' is in contact with the second conductive portions 262a' which is adjacent thereto to be conductible.

In each of the second conductive portions 262a', the second conductive particles 262a are partially melted and then fixed at a portion where the second conductive particles 262a are in contact with each other to form a neck structure.

Further, in the second conductive layer 262, some of the second conductive particles 262a is not melted to be present while maintaining a close distance between the particles. Some of the second conductive particles 262a which is not melted as described above is enclosed by the second curable resin portion 262b' so as not to be in contact with each other.

In the first conductive layer 261, most of the first conductive particles 261a is melted and then fused (fixed) to be a large lump to form the first conductive portion 261a'. Accordingly, the linear resistance is lowered and the contact resistance with the signal line 140 and the link line 150 is lowered, and thus, the current amount transmitted to the signal line 140 and the link line 150 is significantly increased. The second conductive layer 262 includes a plurality of second conductive portions 262a' in which the second conductive particles 262a maintain a spherical shape somewhat and are partially in contact with each other to have a neck structure formed by fused contact portions. By doing this, an unevenness structure is formed on the surface of the side line 260 to improve the surface hardness. Consequently, the power efficiency of the display device 200B is improved and the mechanical property is improved.

Figure 5:
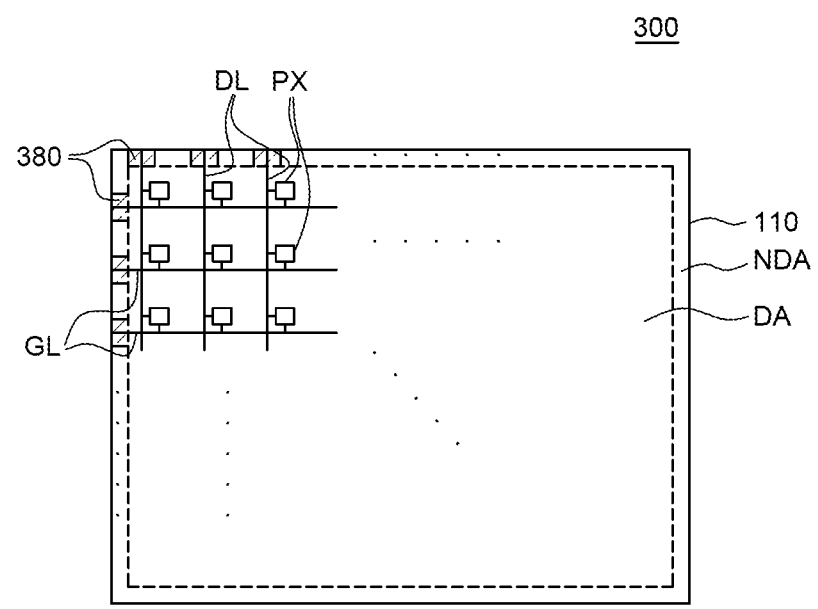
FIG. 5 is a top view of a first substrate in a display device according to another embodiment of the present disclosure.
Figure 6:
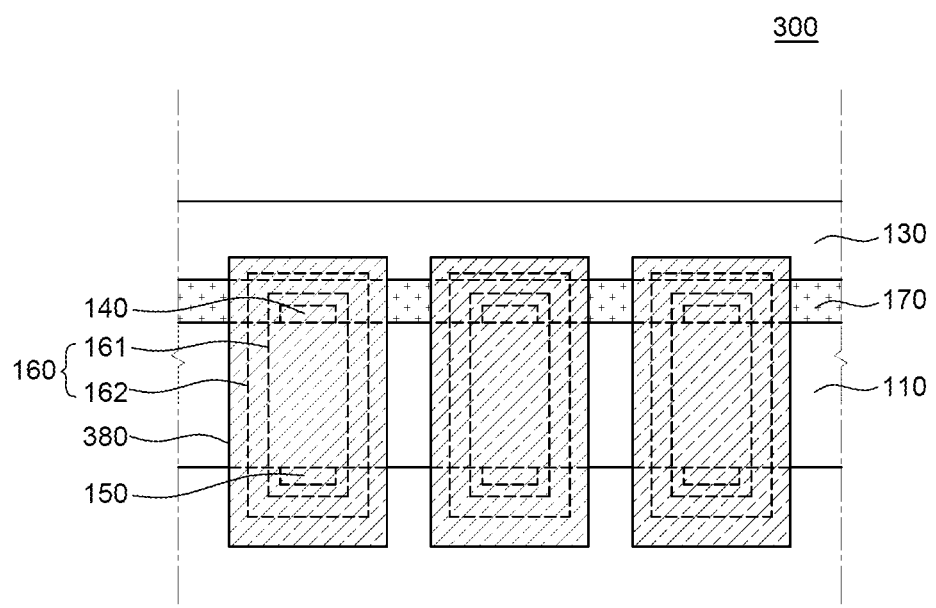
FIG. 6 is a side view of a display device according to still another embodiment of the present disclosure.

FIG. 5 is a top view of a first substrate in a display device according to another embodiment of the present disclosure. FIG. 6 is a side view of a display device according to still another embodiment of the present disclosure. As compared with the display device illustrated in FIGS. 1 to 3, except for the placement structure of the protective layer of the embodiment illustrated in FIGS. 5 and 6, the other components are substantially the same. Therefore, a redundant description will be omitted.

Referring to FIGS. 5 and 6, in a display device 300 according to another embodiment of the present disclosure, a protective layer 380 is patterned to cover the plurality of side lines 160 patterned to connect corresponding signal lines 140 and link lines 150 to each other. That is, differently from the protective layer 180 formed as one continuous layer along a corner of the first substrate 110 to cover all the plurality of side lines 160, the protective layer 380 of FIGS. 5 and 6 has a structure patterned to correspond to the plurality of side lines 160.

Specifically, the protective layer 380 may include a first protective pattern and a second protective pattern. The first protective pattern covers a side line 160 which connects the gate line GL formed on the upper surface of the first substrate 110 and the gate link line formed on the rear surface of the first substrate 110. The second protective pattern covers a side line which connects the data line DL formed on the upper surface of the first substrate 110 and the data link line formed on the rear surface of the first substrate 110.

For example, the protective layer 380 may be formed to have a structure patterned on the side line 160 disposed on the side surface of the first substrate 110 by means of the laser transfer printing, but is not limited thereto.

Figure 7:
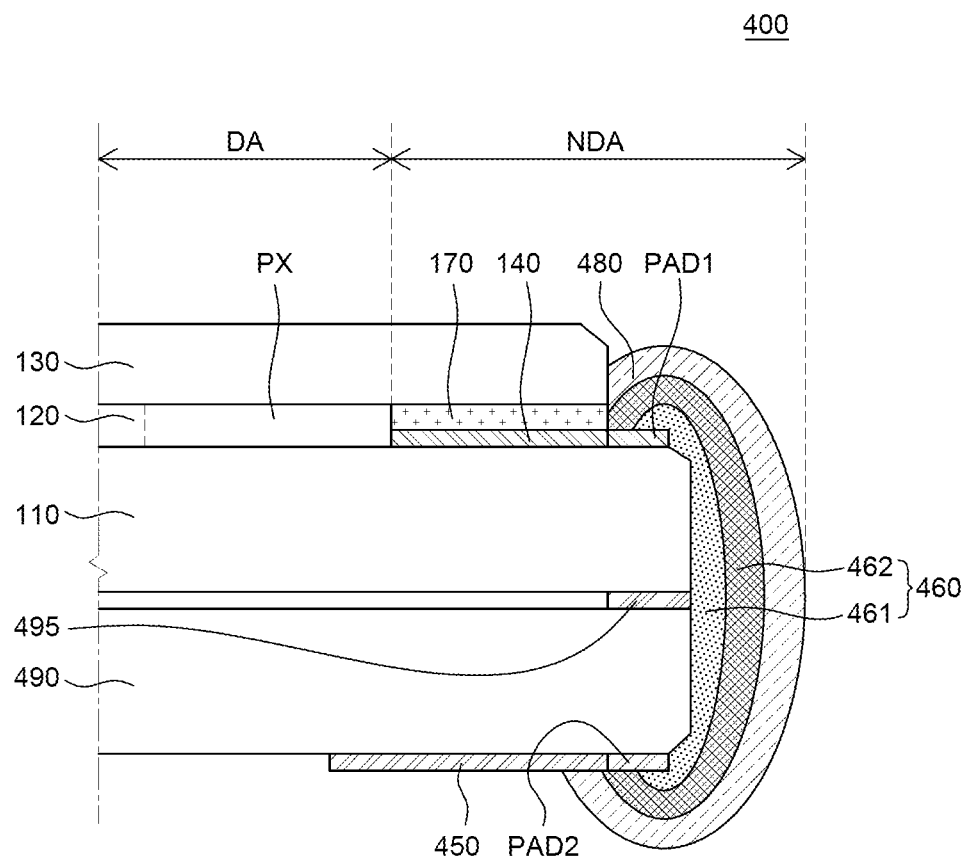
FIG. 7 is a cross-sectional view of a display device according to still another embodiment of the present disclosure.
Figure 8:
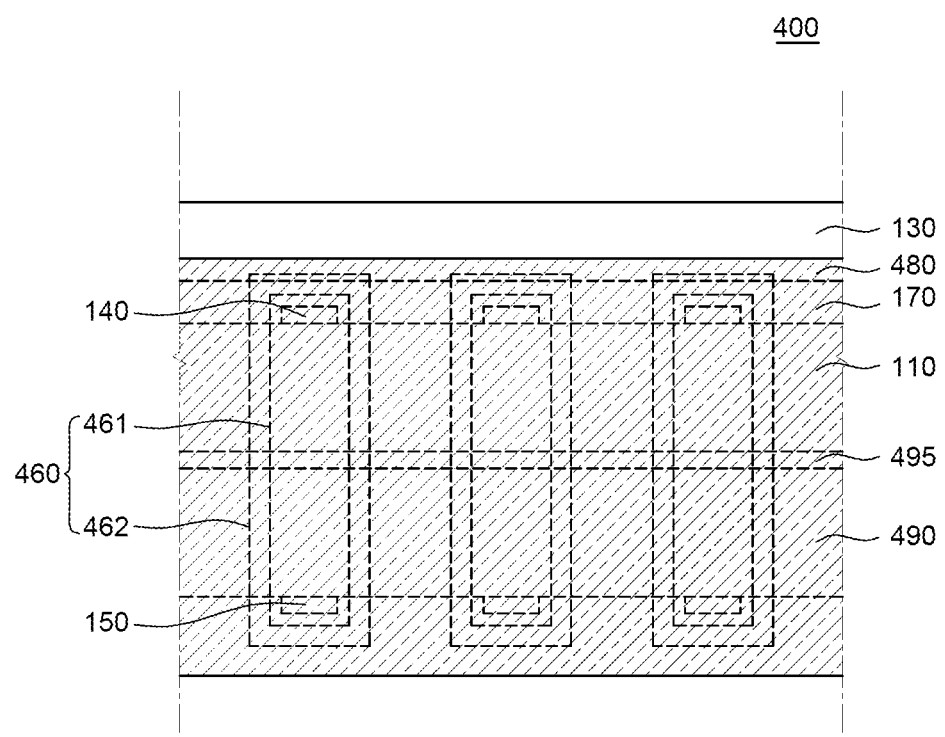
FIG. 8 is a side view of a display device according to still another embodiment of the present disclosure.
Figure 9:
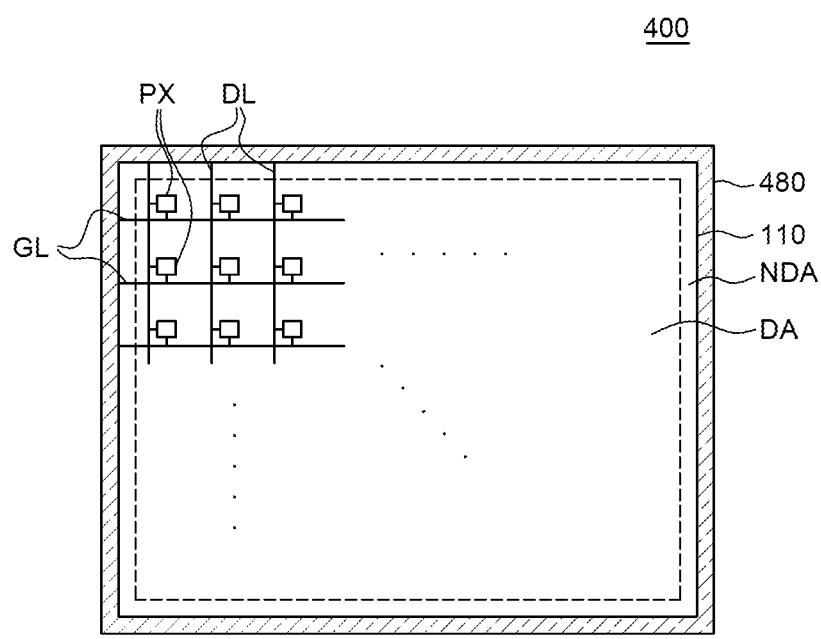
FIG. 9 is a top view of a first substrate in a display device according to still another embodiment of the present disclosure.

FIGS. 7 to 9 are views for explaining a display device according to still another embodiment of the present disclosure. FIG. 7 is a cross-sectional view of a display device according to still another embodiment of the present disclosure. FIG. 8 is a side view of a display device according to still another embodiment of the present disclosure. FIG. 9 is a top view of a first substrate in a display device according to still another embodiment of the present disclosure.

As compared with the display device illustrated in FIGS. 1 to 3, an embodiment illustrated in FIGS. 7 to 9 further includes a third substrate on a rear surface of the first substrate and has different structures of a plurality of link lines, a plurality of side lines, and a protective layer. However, the other components are substantially the same, so that a redundant description will be omitted.

Referring to FIGS. 7 to 9 together, a third substrate 490 is disposed on a rear surface of the first substrate 110. The third substrate 490 is an auxiliary substrate which supports components below the display device 400. The third substrate 490 may be formed of an insulating material. For example, the third substrate 490 may be a glass or plastic material. The third substrate 490 may be formed of the same material as the first substrate 110.

An adhesive layer 495 is disposed between the first substrate 110 and the third substrate 490. The adhesive layer 495 bonds the first substrate 110 and the third substrate 490. The adhesive layer 495 may be disposed on the first substrate 110 or the third substrate 490 so as to correspond to the non-display area NDA of the first substrate 110. However, it is not limited thereto so that the adhesive layer 495 may be disposed in the entire area between the first substrate 110 or the third substrate 490.

In the case of the display device 100 illustrated in FIGS. 1 to 3, the display unit 120 and the plurality of signal lines 140 are disposed on an upper surface of the first substrate 110 and the link line 150 and the driving circuit are disposed on a rear surface of the first substrate 110. When components are disposed on both surfaces of one substrate as described above, during the process of disposing some components on one surface after disposing the other components on the other surface, it is difficult to secure the stability of the process.

Accordingly, the display device 400 may be easily manufactured by a process of bonding the first substrate 110 and the third substrate 490 after disposing the display unit 120 and the signal line 140 on the first substrate 110 and disposing the link line 450 and the driving circuit on the third substrate 490. Further, it is advantageous for the stability of the process and the reliability of the product.

Referring to FIGS. 7 and 8 together, a plurality of link lines 450 is formed on the rear surface of the third substrate 490. Specifically, the plurality of gate link lines and the plurality of data link lines are formed on the rear surface of the third substrate 490. Further, on the rear surface of the third substrate 490, a gate driving circuit is disposed to be electrically connected to the plurality of gate link lines and a data driving circuit is disposed to be electrically connected to the plurality of data link lines.

The plurality of side lines 460 is disposed on the side surfaces of the first substrate 110 and the third substrate 490. The plurality of side lines 460 is disposed to cover ends of the plurality of signal lines disposed on the upper surface of the first substrate 110, side surfaces of the first substrate 110 and the third substrate 490 and ends of the plurality of link lines 450 disposed on the rear surface of the third substrate 490.

Specifically, the first conductive layer 461 is disposed to be in direct with the plurality of signal lines 140 disposed on the upper surface of the first substrate 110, the side surface of the first substrate 110, the side surface of the third substrate 490, and the plurality of link lines 450 disposed on the rear surface of the third substrate 490. The second conductive layer 462 is disposed to be in direct contact with an upper surface of the plurality of signal lines 140 which is not covered by the first conductive layer 461 to be exposed, the first conductive layer 461, and the plurality of link lines 450 disposed on the rear surfaces of the third substrate 490.

Referring to FIGS. 7 to 9 together, the protective layer 480 is continuously disposed to fully cover from one end of the second conductive layer 462 to the other end of the second conductive layer 462.

Figure 10:
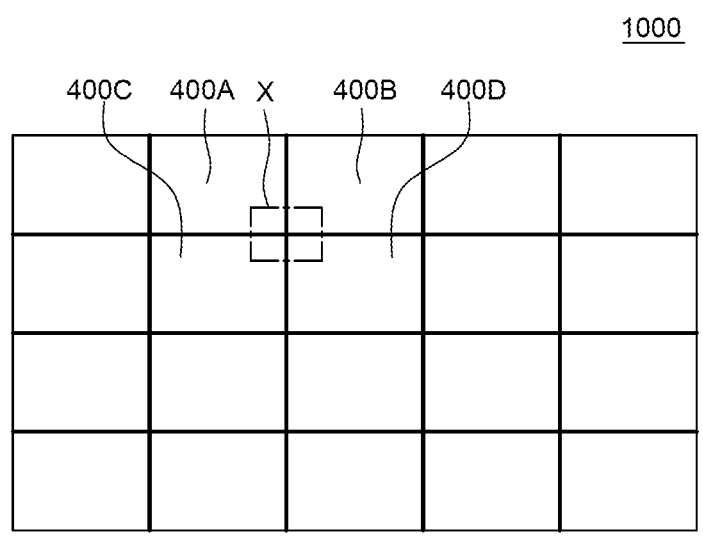
FIG. 10 is a plan view of a multi-panel display device according to an embodiment of the present disclosure.
Figure 11:
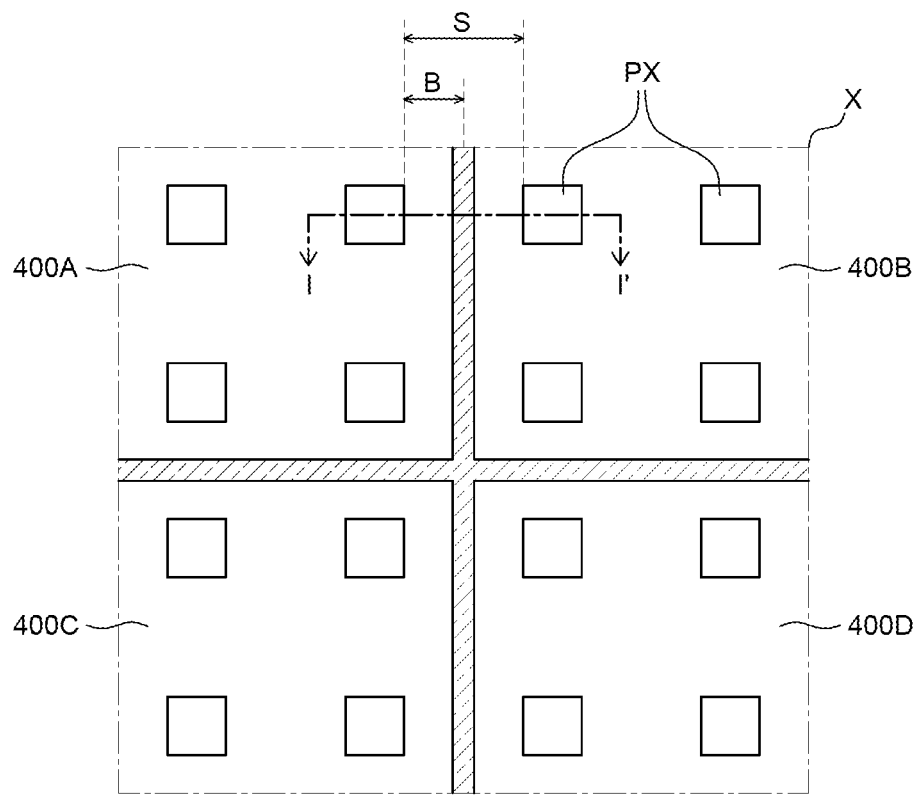
FIG. 11 is an enlarged plan view of a region X of FIG. 10.
Figure 12:
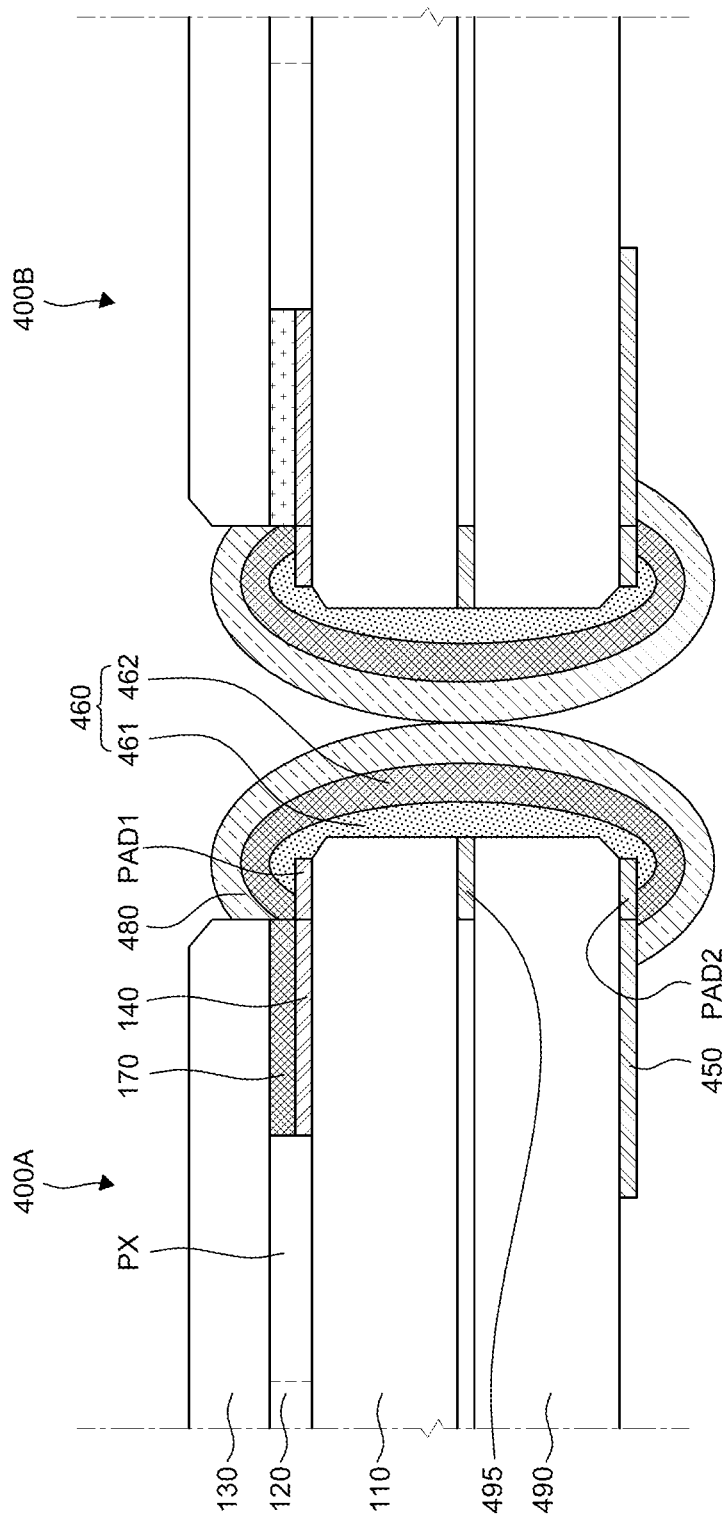
FIG. 12 is a cross-sectional view taken along the line I-I' of FIG. 11.

FIGS. 10 to 12 are views for explaining a multi-panel display device according to an embodiment of the present disclosure. FIG. 10 is a plan view of a multi-panel display device according to an embodiment of the present disclosure, FIG. 11 is an enlarged plan view of a region X of FIG. 10, and FIG. 12 is a cross-sectional view taken along the line I-I' of FIG. 11.

Referring to FIG. 10, a multi-panel display device 1000 according to an embodiment of the present disclosure includes a plurality of display devices 400A, 400B, 400C, and 400D. The plurality of display devices 400A, 400B, 400C, and 400D is disposed in a m×n tile pattern to be implemented as one multi-panel display device 1000. For the convenience of description, in FIG. 10, even though it is illustrated that 20 display devices are disposed in a 5×4 tile pattern, the present disclosure is not limited thereto so that an appropriate number of display devices may be disposed as needed.

Referring to FIG. 11 enlarging a region X of FIG. 10, the plurality of display devices may be disposed to be in contact with each other vertically or horizontally. For example, the plurality of display devices 400A, 400B, 400C, and 400D includes a first display device 400A, a second display device 400B, a third display device 400C, and a fourth display device 400D. The first display device 400A and the second display device 400B are disposed to be in contact with each other horizontally and the third display device 400C and the fourth display device 400D are disposed to be in contact with each other vertically.

FIG. 12 is a cross-sectional view taken along the line I-I' of FIG. 11. Referring to FIG. 12, in the multi-panel display device 1000 according to the embodiment of the present disclosure, the first display device 400A and the second display device 400B are disposed to be in contact with each other horizontally. The display devices 400A and 400B are substantially the same as the display device 400 illustrated in FIG. 7 so that a redundant description will be omitted.

Referring to FIG. 12, each of the first display device 400A and the second display device 400B includes a side line 460 including the first conductive layer 461 and the second conductive layer 462. At this time, the first conductive layer 461 includes first conductive particles having a relatively small particle size and the second conductive layer 462 includes second conductive particles having a larger particle size than that of the first conductive particles.

The first conductive layer 461 is formed by sintering the first conductive particles having a relatively small particle size to lower the linear resistance and the contact resistance with the signal line 140 and the link line 450. Therefore, it is possible to significantly improve a current amount transmitted to the signal line 140 and the link line 450 by means of the first conductive layer.

The second conductive layer 462 is disposed to cover the first conductive layer 461 to protect the first conductive layer 461. Further, the second conductive layer 462 is formed by sintering the second conductive particles having a relatively larger particle size to compensate for a low surface hardness of the first conductive layer 461 to improve the mechanical property of the side line 460.

Since the multi-panel display device includes a plurality of display devices, the luminance and a circuit integration are advanced so that the power consumption is inevitably significant. However, the multi-panel display device 1000 of the present disclosure applies a side line (460) structure in which the first conductive layer 461 and the second conductive layer 462 are laminated so that the current transmitted to the signal line 140 and the link line 150 by means of the side line 460 is significantly increased. By doing this, the power efficiency is improved.

Further, the multi-panel display device 1000 according to the present disclosure is manufactured by laminating the first conductive layer 461 which improves an electrical characteristic without increasing a thickness of the side line 460 and a second conductive layer 462 which improves the mechanical property of the side line. Therefore, the bezel area B is not increased. Further, the seam S is minimized so that one image may be displayed on the multi-panel display device 1000 without causing a sense of disconnection and awkwardness due to the seam S. Further, the high quality multi-panel display device 1000 with improved power efficiency and improved reliability is provided.

Hereinafter, the effects of the present disclosure will be described in more detail with reference to Examples. However, the following Examples are set forth to illustrate the present disclosure, but the scope of the disclosure is not limited thereto.

EXAMPLES

Example 1

A first paste containing 80 weight % of silver nano particles having a particle size D50 of 200 nm to 300 nm and 20 weight % of epoxy based curable resin was prepared. The first paste was applied on an ITO glass (500 Å) and briefly dried. Next, a second paste containing 70 weight % of silver nano particles having a particle size D50 of 2 μm to 3 μm and 30 weight % of epoxy based curable resin was prepared. The second paste was applied on the first paste laminated on the ITO glass. Next, a wiring line on which the first conductive layer (2.5 μm) and the second conductive layer (2.5 μm) were laminated was manufactured by performing thermal treatment at 200° C. for 30 to 180 minutes.

Example 2

A wiring line on which the first conductive layer (2.0 μm) and the second conductive layer (3.0 μm) were laminated was manufactured by the same method as Example 1 except that the first paste and the second paste were applied with different thicknesses.

Example 3

A wiring line on which the first conductive layer (1.5 μm) and the second conductive layer (3.5 μm) were laminated was manufactured by the same method as Example 1 except that the first paste and the second paste were applied with different thicknesses.

Comparative Example 1

A wiring line configured by the second conductive layer (5.0 μm) was manufactured by the same method as Example 1 except that the first paste was not applied, and the second paste was applied with a different thickness.

Comparative Example 2

A mixed paste was prepared by mixing a first paste and a second paste at a weight ratio of 50:50 instead of applying the first paste and applying the second paste thereon in Example 1. The mixed paste was applied on the ITO glass (500 Å) and was subjected to a thermal treatment at 200° C. for 30 to 180 minutes to manufacture a wiring line configured by a single conductive layer (5.0 μm).

Comparative Example 3

A first paste including 80 weight % of silver nano particles having a particle size D50 of 200 nm to 300 nm and 20 weight % of epoxy based curable resin was prepared. The first paste was applied on an ITO glass (500 Å). Next, the thermal treatment was performed at 200° C. for 30 to 180 minutes to manufacture a wiring line configured by a single conductive layer (5.0 μm).

Comparative Example 4

A wiring line on which the second conductive layer (2.5 μm) and the first conductive layer (2.5 μm) were sequentially laminated was manufactured by the same method as Example 1 except that the first paste and the second paste were laminated in a different order.

Experimental Example

A linear resistance, a contact resistance, and a surface hardness of a wiring line according to Examples, Referential Example, and Comparative Example were measured by the following method and the reliability was evaluated by a migration test.

1. Linear Resistance and Contact Resistance

A four-point probe type surface resistance measurement unit was used to measure a linear resistance (a thickness of 2.5 μm and an area of 40 mm$^2$) and a contact resistance at a room temperature. At the same thermal treatment temperature of 200° C., when the thermal treatment times were 30 minutes, 60 minutes, and 180 minutes, the linear resistance and the contact resistance were measured. The results are described in the following Table 1.

2. Surface Hardness

A surface of specimen was scratched by a pencil while applying a load of 500 g to a specimen and then a scratch of the surface was measured with naked eye. At the same thermal treatment temperature of 200° C., when the thermal treatment times were 30 minutes, 60 minutes, and 180 minutes, the surface hardness was measured. The results are described in the following Table 1.

3. Reliability (Migration Test)

A time when a short was generated in an electrode due to silver (Au) migration was measured while applying a constant voltage to the specimen in a chamber of a high temperature (85° C.) and a high humidity (85%). The results are described in the following Table 1.

TABLE 1

| | | Classification | | | | | | |
|---|---|---|---|---|---|---|---|---|
| | | EX. 1 | EX. 2 | EX. 3 | Comp. EX. 1 | Comp. EX. 2 | Comp. EX. 3 | Comp. EX. 4 |
| | | | | | Line structure | | | |
| | | NPs (2.5 μm)/MPs (2.5 μm) | NPs (2.0 μm)/MPs (3.0 μm) | NPs (1.5 μm)/MPs (3.5 μm) | MPs (5 μm) | NPs + MPs (5 μm) | NPs (5 μm) | MPs (2.5 μm)/NPs (2.5 μm) |
| Linear resistance (Ω) | 30 min | 6.6 | 6.6 | 6.4 | 8.9 | 7.9 | 1.9 | 6.5 |
| [0001] | 60 min | 5.8 | 5.8 | 5.4 | 7.2 | 7.6 | 1.4 | 5.9 |
| [0001] | 180 min | 5.1 | 5.1 | 4.9 | 7.6 | 7.1 | 1.3 | 5.2 |
| Contact resistance (Ω) | 30 min | 18.2 | 18.1 | 16.6 | 31.9 | 29.2 | 19.2 | 31.2 |
| [0001] | 60 min | 17.1 | 17.3 | 16.3 | 31.1 | 29.1 | 17.2 | 30.4 |
| [0001] | 180 min | 16.9 | 16.8 | 16.1 | 31.0 | 29.4 | 16.9 | 30.0 |
| Pencil hardness | 30 min | 3H | 3H | 3H | 3H | 1H | <1H | <1H |
| [0001] | 60 min | 3H | 3H | 3H | 3H | 2H | <1H | 1H |
| [0001] | 180 min | 3H | 3H | 3H | 3H | 2H | <1H | 1H |
| Reliability (time) | | 1010 | 1290 | 1280 | 1380 | 860 | 660 | 1010 |

(in Table 1, NPs is a conductive layer formed by a first paste including silver nano particles having a size of 200 nm to 300 nm, MPs is a conductive layer formed by a second paste including micro particles having a size of 2 μm to 3 μm, and NPs+MPs is a conductive formed by mixed pastes including silver nano particles and silver micro particles).

Referring to Table 1, it is confirmed that the wiring lines of Examples 1 to 3 in which the first conductive layer and the second conductive layer are laminated has a low linear resistance, a low contact resistance, a high pencil hardness, and excellent reliability. Specifically, it is confirmed that according to Examples 2 and 3 in which the thickness of the second conductive layer formed by silver micro particles having a relatively larger particle size is larger, the electrical characteristic and the surface hardness characteristic are equal to those of Example 1 and the reliability is more excellent.

The wiring line of Comparative Example 1 is formed of a single conductive layer which is formed by silver micro particles having a relatively larger particle size. The wiring line of Comparative Example 1 includes particles having relatively large particle size, the particles are less fused under the same sintering condition. Therefore, it is understood that the linear resistance and the contact resistance are large and specifically, the contact resistance is significantly large as compared with Examples.

When wiring line of Comparative Example 2 formed by the mixed paste including both the silver nano particles and silver micro particles includes the silver nano particles which are quickly melted by the thermal treatment. Therefore, it is confirmed that the linear resistance and the contact resistance are reduced as compared with Comparative Example 1. However, it is also confirmed that as compared with Examples 1 to 3, the linear resistance and the contact resistance are significantly high and the surface hardness is significantly low, and silver (Ag) migration is easily generated.

Further, according to Comparative Example 3, the single layered wiring line formed by the first paste is formed by silver nano particles so that the contact area is large so that it is confirmed that the linear resistance is lowest and the contact resistance is equal to that of Examples. However, it is confirmed that the surface hardness is 1H or lower which is very low and it is vulnerable to moisture permeation so that the silver migration is most quickly generated.

In the case of Comparative Example 4 having a different laminating order from that of Example 1, the conductive layer formed by the first paste having excellent electrical characteristic is located on an upper portion so that the linear resistance is low. However, it is confirmed that the contact resistance is very low and the surface hardness is significantly bad.

In summary of the above-described experiment results, the first conductive layer is formed by silver nano particles having a particle size (D50) of 200 nm to 300 nm and the second conductive layer is laminated with the paste including the silver micro particles having a particle size (D50) of 2 μm to 3 μm on the first conductive layer. Therefore, it is confirmed that the surface hardness is improved, and the silver migration is suppressed while lowering both the linear resistance and the contact resistance of the wiring line.

Accordingly, when the lamination structure of the first conductive layer and the second conductive layer is applied to the side electrode of the display device, the current amount of the side electrode is improved to improve the power efficiency of the display device. Further, the surface hardness of the side line is improved and the migration is suppressed to suppress the short of the electrode so that the display device with an improved reliability may be provided. Further, the wiring line on which the first conductive layer and the second conductive layer are laminated may simultaneously improve the electrical characteristic and the surface hardness without increasing the thickness of the wiring line as compared with the related art. Therefore, such a wiring line may implement the narrow bezel display device and may be applied to the multi-panel display device.

The embodiments of the present disclosure can also be described as follows:

According to an aspect of the present disclosure, a display device comprise a first substrate including a display area and a non-display area enclosing the display area, a display unit including an organic light emitting diode disposed on an upper surface of the first substrate, a plurality of signal lines which is disposed on the upper surface of the first substrate and is electrically connected to the display unit, a plurality of link lines disposed below the first substrate, and a plurality of side lines which is disposed on a side surface of the first substrate, connects the plurality of signal lines and the plurality of link lines, each of the plurality of side lines includes a first conductive layer which is disposed on the side surface of the first substrate and is formed of first conductive particles and a second conductive layer which covers the first conductive layer and is formed of second conductive particles having a particle size larger than that of the first conductive particle.

A particle size of the first conductive particles may be 10 nm to 400 nm and a particle size of the second conductive particles may be 1 μm to 5 μm.

A sum of thicknesses of the first conductive layer and the second conductive layer may be 4 μm to 10 μm and a thickness of the first conductive layer may be 1 μm to 6 μm.

A ratio of a thickness of the second conductive layer to a thickness of the first conductive layer is 1:0.3 to 1:1.

The first conductive layer may include a first conductive portion formed by sintering the first conductive particles and the second conductive layer may include a second conductive portion formed by sintering the second conductive particles.

The second conductive portion may have a structure in which the second conductive particles are in contact with each other to be aggregated.

The second conductive portion may have a neck structure in a portion that the second conductive particles are in contact with each other.

The first conductive layer may include the first conductive particles and resin, and the second conductive layer may include the second conductive particles and resin.

The first conductive layer may include 10 weight % to 30 weight % of resin based on a sum of the first conductive particles and the resin and the second conductive layer may include 20 weight % to 40 weight % of resin based on a sum of the second conductive particles and the resin.

The first conductive layer may be in direct contact with the plurality of signal lines, a side surface of the first substrate, and the plurality of link lines and the second conductive layer may cover the first conductive layer and may be in direct contact with the plurality of signal lines and the plurality of link lines.

The display device may further comprise a protective layer which covers the plurality of side lines and includes a black material.

The protective layer may be formed as one layer to enclose all side surfaces of the first substrate and cover all the plurality of side lines or may be patterned so as to correspond to each of the plurality of side lines.

The display device may further comprise a second substrate which is disposed on the display unit so as to be opposite to the first substrate, wherein the first substrate may protrude outwardly from the second substrate, the plurality of signal lines may be disposed on the protruding first substrate, and the plurality of side lines may be disposed to be in contact with an exposed upper surface and side surface of the plurality of signal lines.

The display device may further comprise a third substrate disposed below the first substrate, wherein the plurality of link lines may be disposed on a lower surface of the third substrate and the plurality of side lines may be disposed to cover the plurality of signal lines, the first substrate, the third substrate, and side surfaces of the plurality of link lines.

According to another aspect of the present disclosure, a multi-panel display device comprise a plurality of display devices disposed to be adjacent to each other, wherein each of the plurality of display devices includes a first substrate including a display area and a non-display area enclosing the display area, a display unit including an organic light emitting diode disposed on an upper surface of the first substrate, a plurality of signal lines which is disposed on the upper surface of the first substrate and is electrically connected to the display unit, a plurality of link lines disposed below the first substrate, a plurality of side lines which is disposed on a side surface of the first substrate, connects the plurality of signal lines and the plurality of link lines; and a protective layer which covers the plurality of side lines and includes a black material, each of the plurality of side lines includes a first conductive layer which is disposed on the side surface of the first substrate and is formed of first conductive particles; and a second conductive layer which covers the first conductive layer and is formed of second conductive particles having a particle size larger than that of the first conductive particles.

A particle size of the first conductive particles may be 10 nm to 400 nm and a particle size of the second conductive particles may be 1 μm to 5 μm.

A sum of thicknesses of the first conductive layer and the second conductive layer may be 4 μm to 10 μm and a thickness of the first conductive layer may be 1 μm or larger.

A ratio of a thickness of the second conductive layer to a thickness of the first conductive layer may be 1:0.3 to 1:1.

The first conductive layer may include a first conductive portion formed by sintering the first conductive particles and the second conductive layer may include a second conductive portion formed by sintering the second conductive particles.

The second conductive portion may have a structure in which the second conductive particles may be in contact with each other to be aggregated.

The second conductive portion may have a neck structure in a portion that the second conductive particles may be in contact with each other.

Each of the first conductive layer and the second conductive layer may further include resin, the first conductive layer may include 10 weight % to 30 weight % of the resin based on a sum of the first conductive particles and the resin, and the second conductive layer may include 20 weight % to 40 weight % of the resin based on a sum of the second conductive particles and the resin.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a first substrate including a display area and a non-display area enclosing the display area;
a display panel including an organic light emitting diode, the display panel disposed on an upper surface of the first substrate;
a plurality of signal lines disposed on the upper surface of the first substrate, the plurality of signal lines electrically connected to the display panel;
a plurality of link lines disposed below the first substrate; and
a plurality of side lines disposed on a side surface of the first substrate, the plurality of side lines connected to the plurality of signal lines and the plurality of side lines connected to the plurality of link lines, each of the plurality of side lines including:
a first conductive layer disposed on the side surface of the first substrate, the first conductive layer including first conductive particles; and
a second conductive layer which covers the first conductive layer, the second conductive layer including second conductive particles having a particle size greater than a particle size of the first conductive particles.

2. The display device according to claim 1, wherein the particle size of the first conductive particles is 10 nm to 400 nm and the particle size of the second conductive particles is 1 μm to 5 μm.

3. The display device according to claim 1, wherein a sum of a thickness of the first conductive layer and a thickness of the second conductive layer is 4 μm to 10 μm and the thickness of the first conductive layer is 1 μm to 6 μm.

4. The display device according to claim 1, wherein a ratio of a thickness of the second conductive layer to a thickness of the first conductive layer is 1:0.3 to 1:1.

5. The display device according to claim 1, wherein the first conductive layer includes a first conductive portion including at least a portion of the first conductive particles sintered together and the second conductive layer includes a second conductive portion including at least a portion of the second conductive particles sintered together.

6. The display device according to claim 5, wherein the second conductive portion includes the second conductive particles aggregated together and in contact with each other.

7. The display device according to claim 6, wherein at least the portion of the second conductive particles sintered together in the second conductive portion have a neck structure in a region where the second conductive particles are in contact with each other.

8. The display device according to claim 1, wherein the first conductive layer includes the first conductive particles and resin, and the second conductive layer includes the second conductive particles and resin.

9. The display device according to claim 8, wherein the first conductive layer includes 10% by weight to 30% by weight of resin relative to a sum of a weight of the first conductive particles and a weight of the resin of the first conductive layer and the second conductive layer includes 20% by weight to 40% by weight of resin relative to a sum of a weight of the second conductive particles and a weight of the resin of the second conductive layer.

10. The display device according to claim 1, wherein the first conductive layer is in direct contact with the plurality of signal lines, the side surface of the first substrate, and the plurality of link lines and the second conductive layer covers the first conductive layer, the second conductive layer in direct contact with the plurality of signal lines and the plurality of link lines.

11. The display device according to claim 1, further comprising:
a protective layer which covers the plurality of side lines and includes a black material.

12. The display device according to claim 11, wherein the protective layer is one layer that encloses all side surfaces of the first substrate and covers all the plurality of side lines, or the protective layer is patterned to correspond to each of the plurality of side lines.

13. The display device according to claim 1, further comprising:
a second substrate disposed on the display panel opposite to the first substrate,
wherein a portion of the first substrate extends beyond an outer edge of the second substrate, the plurality of signal lines disposed on the portion of the first substrate extending beyond the second substrate, and the plurality of side lines is in contact with an exposed upper surface and an exposed side surface of the plurality of signal lines.

14. The display device according to claim 1, further comprising:
a third substrate disposed below the first substrate,
wherein the plurality of link lines is disposed on a lower surface of the third substrate and the plurality of side lines cover the plurality of signal lines, the first substrate, the third substrate, and side surfaces of the plurality of link lines.

15. A multi-panel display device, comprising:
a plurality of display devices disposed adjacent to each other, each of the plurality of display devices including:
a first substrate including a display area and a non-display area enclosing the display area;
a display panel including an organic light emitting diode, the display panel disposed on an upper surface of the first substrate;
a plurality of signal lines disposed on the upper surface of the first substrate, the plurality of signal lines electrically connected to the display panel;
a plurality of link lines disposed below the first substrate;
a plurality of side lines disposed on a side surface of the first substrate, the plurality of side lines connected to the plurality of signal lines and the plurality of side lines connected to the plurality of link lines; and
a protective layer which covers the plurality of side lines and includes a black material,
each of the plurality of side lines including:
a first conductive layer disposed on the side surface of the first substrate, the first conductive layer including first conductive particles; and a second conductive layer which covers the first conductive layer, the second conductive layer including second conductive particles having a particle size greater than a particle size of the first conductive particles.

16. The multi-panel display device according to claim 15, wherein the particle size of the first conductive particles is 10 nm to 400 nm and the particle size of the second conductive particles is 1 μm to 5 μm.

17. The multi-panel display device according to claim 15, wherein a sum of a thickness of the first conductive layer and a thickness of the second conductive layer is 4 μm to 10 μm and the thickness of the first conductive layer is 1 μm or larger.

18. The multi-panel display device according to claim 15, wherein a ratio of a thickness of the second conductive layer to a thickness of the first conductive layer is 1:0.3 to 1:1.

19. The multi-panel display device according to claim 15, wherein the first conductive layer includes a first conductive portion including the first conductive particles sintered together and the second conductive layer includes a second conductive portion including the second conductive particles sintered together.

20. The multi-panel display device according to claim 19, wherein the second conductive portion includes the second conductive particles aggregated together and in contact with each other.

21. The multi-panel display device according to claim 20, wherein the second conductive particles sintered together in the second conductive portion have a neck structure in a region where the second conductive particles are in contact with each other.

22. The multi-panel display device according to claim 15, wherein each of the first conductive layer and the second conductive layer further include a resin, the first conductive layer including 10% by weight to 30% by weight of the resin relative to a sum of a weight of the first conductive particles and a weight of the resin of the first conductive layer, and the second conductive layer includes 20% by weight to 40% by weight of the resin relative to a sum of a weight of the second conductive particles and a weight of the resin of the second conductive layer.

* * * * *